(12) United States Patent
Wu et al.

(10) Patent No.: US 10,515,172 B2
(45) Date of Patent: Dec. 24, 2019

(54) RC TOOL ACCURACY TIME REDUCTION

(71) Applicant: Taiwan Semiconductor Manufacturing Company Limited, Hsinchu (TW)

(72) Inventors: Hui-I Wu, Hsinchu County (TW); Ke-Ying Su, Taipei (TW); Wan-Ting Lo, Taipei (TW); Niranjan Vepuri, Hsinchu (TW); Hsiang-Ho Chang, Miaoli County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/159,779

(22) Filed: Oct. 15, 2018

(65) Prior Publication Data
US 2019/0121928 A1 Apr. 25, 2019

Related U.S. Application Data

(60) Provisional application No. 62/574,819, filed on Oct. 20, 2017.

(51) Int. Cl.
*G06F 9/455* (2018.01)
*G06F 17/50* (2006.01)

(52) U.S. Cl.
CPC ........ *G06F 17/5059* (2013.01); *G06F 17/504* (2013.01); *G06F 17/5031* (2013.01); *G06F 17/5036* (2013.01); *G06F 17/5081* (2013.01)

(58) Field of Classification Search
USPC .......................... 716/106, 108, 111, 113, 134
See application file for complete search history.

(56) References Cited

U.S. PATENT DOCUMENTS

| 6,301,693 B1 * | 10/2001 | Naylor | G06F 17/5072 716/114 |
| 2004/0153413 A1 * | 8/2004 | Gross | G06Q 30/0281 705/52 |
| 2018/0260498 A1 * | 9/2018 | Nagaraja | G06F 17/505 |

* cited by examiner

*Primary Examiner* — Brian Ngo
(74) *Attorney, Agent, or Firm* — Jones Day (57) ABSTRACT

Fabricating a first semiconductor device cell using a first process based on a first process parameter or material comprises extracting semiconductor device parameters from the first process parameters to obtain extracted semiconductor device parameters of a first semiconductor device cell. The fabrication process includes training an artificial intelligence to obtain a predictive artificial intelligence using training data as input, the training data comprising the extracted semiconductor device cell parameters and the first process parameter or material. A proposed process modification is provided to the predictive artificial intelligence to generate a predicted cell delay by the predictive artificial intelligence. The predicted cell delay is evaluated against a cell delay threshold. When the predicted cell delay satisfies the cell delay threshold, a new semiconductor device cell is fabricated using a modified process incorporating the proposed process modification.

20 Claims, 10 Drawing Sheets

RC TOOL ACCURACY TIME REDUCTION

CROSS-REFERENCE TO RELATED APPLICATIONS

This application claims priority to U.S. provisional patent application 62/574,819, filed Oct. 20, 2017, the entire contents of which are incorporated by reference herein.

FIELD

The technology described in this disclosure relates generally to semiconductor device fabrication.

BACKGROUND

Semiconductor devices may be fabricated according to a process. A semiconductor fabrication process requires substantial physical foundry infrastructure committed to a fabrication task for a lengthy period of time. Changes to such a process may requires expensive reconfiguration of foundry infrastructure and if a change to a process fails to achieve desired results, such failure may not be apparent until after a significant outlay of time and resources. Thus, analysis techniques are employed to identify negative impacts of a process change before such a change is physically implemented. Given the enormous number of variables necessary to accurately model a modern semiconductor device formed of a fabrication process, analysis techniques themselves can require many weeks to perform.

BRIEF DESCRIPTION OF THE DRAWINGS

Aspects of the present disclosure are best understood from the following detailed description when read with the accompanying figures. It is noted that, in accordance with the standard practice of the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Implementing a process change in a semiconductor fabrication foundry can be cumbersome. Proposed changes to a process, such as a change to enhance RC tool accuracy, often require validation or certification before the change will actually be implemented in a physical fabricated semiconductor device. Validation or certification of a target process change typically involves a computer based modelling of a semiconductor device fabricated according to a proposed target change. But, computer based modelling of modern semiconductor devices and device fabrication processes is itself a costly and timely process given the large number of independent variables within a such semiconductor device, like a system on a chip, or a memory array, or a CPU.

In one embodiment herein, systems and methods of tuning RC tools of a fabrication process include an artificial intelligence performing machine learning tasks to learn the sensitivity of a system to changes in process parameters. Fabrication systems and processes train a predictive AI using machine learning techniques. A trained predictive artificial intelligence can then be utilized to accelerate semiconductor device fabrication of new semiconductor devices based on proposed fabrication process optimizations. Semiconductor device fabrication according to the techniques disclosed herein is accomplished faster from a time a modified semiconductor device fabrication process is determined to actual fabrication in physical semiconductor form. For example, in one exemplary realization of these techniques, the process of fabricating a semiconductor device according to a newly proposed process modification is reduced by three weeks.

In known systems and methods of target process validation, a three stage process is used that may take many weeks to complete while monopolizing large amounts of system resources. During this time, a proposed foundry process enhancement implementation remains frozen awaiting the results of process validation. And, if the results fail to satisfy threshold requirements, redesign of a proposed process enhancement again requires certification leading to additional lengthy periods of time awaiting certification. First, a proposed process change is parameterized. Then the parameters are supplied to an RC tool extraction tool, which accepts the process parameters and extracts the parasitic effects of semiconductor structures and the require wiring interconnections for interconnect structures within a fabricated semiconductor device. And finally, the extracted RC parameters are supplied to a simulation tool, which models a new semiconductor device fabricated according to the target process change. Based on the results of device modeling, a target process change is either validated, or, when a violation condition is identified, the process is not validated.

The second and third steps discussed above, RC extraction and device simulation, typically require at least three weeks monopolizing substantial system resources to complete a validation process. Typically, a single foundry process may have many simultaneous target process changes undergoing the validation process, which has long plagued the industry with substantial issues related to resource allocation and scheduling to control RC tool accuracy. To date, known models, such as the three stage process discussed above, employing cutting edge computing systems, have proven unable to scale to accommodate the number of customized process optimizations carried out in a typical foundry without significant delays between completing a target process change model (a frozen model) and final implementation in semiconductor (e.g. silicon, germanium).

As described above, a first step of a three stage process is parameterization of the process change. Process parameters for adjustment may take a variety of forms. One process parameter that may be adjusted as part of an optimization process is a structure thickness and a direction accompanied by corresponding values. For example, the thickness may be a line thickness or a layer thickness or a semiconductor structure thickness. A direction may describe the direction of the thickness relative to a reference direction, or relative to a crystal direction (e.g., <100>, <110>). The process parameters may also include a material value, such as a dielectric value. And process parameters may also include foundry dependent parameters, including parameters specific the tooling or source materials utilized by a foundry.

Next, parasitic extraction, or RC extraction, accepts these parameters and identifies, or extracts, the parasitics of the electronic circuits within a target semiconductor device. Such parasitics include parasitic capacitances, parasitic resistances, and parasitic inductances. A goal of parasitic extraction is to obtain sufficient and accurate information about the semiconductor device circuitry to create an accurate analog model of a semiconductor device circuit to allow detailed software simulation capable of emulating actual digital and analog responses to a physical fabricated semiconductor device that is fabricated according to the target process. Such simulation includes power analysis, timing analysis, circuit simulation, and signal integrity analysis. Parasitic extraction tools typically require over a week executing on high end computer processing systems to complete the parasitic extraction necessary to perform device simulations, e.g. using an EDA tool.

Finally, by simulating circuit performance using EDA tools, a system is able to identify the effects of the parasitics on the circuit behavior. By simulating circuit performance based on modified parasitic behavior, a system is similarly able to identify changes to the device behavior caused by altering the parasitics of a fabricated device, e.g. $\Delta R$, $\Delta C$, from a previous process to a new process that includes a target RC tool optimization under validation. In embodiments, this altered behavior is monitored for violation conditions. For example, a violation condition, which may be an overvoltage, and undervoltage, a current, a rise time, or a cell delay.

Figure 1A:
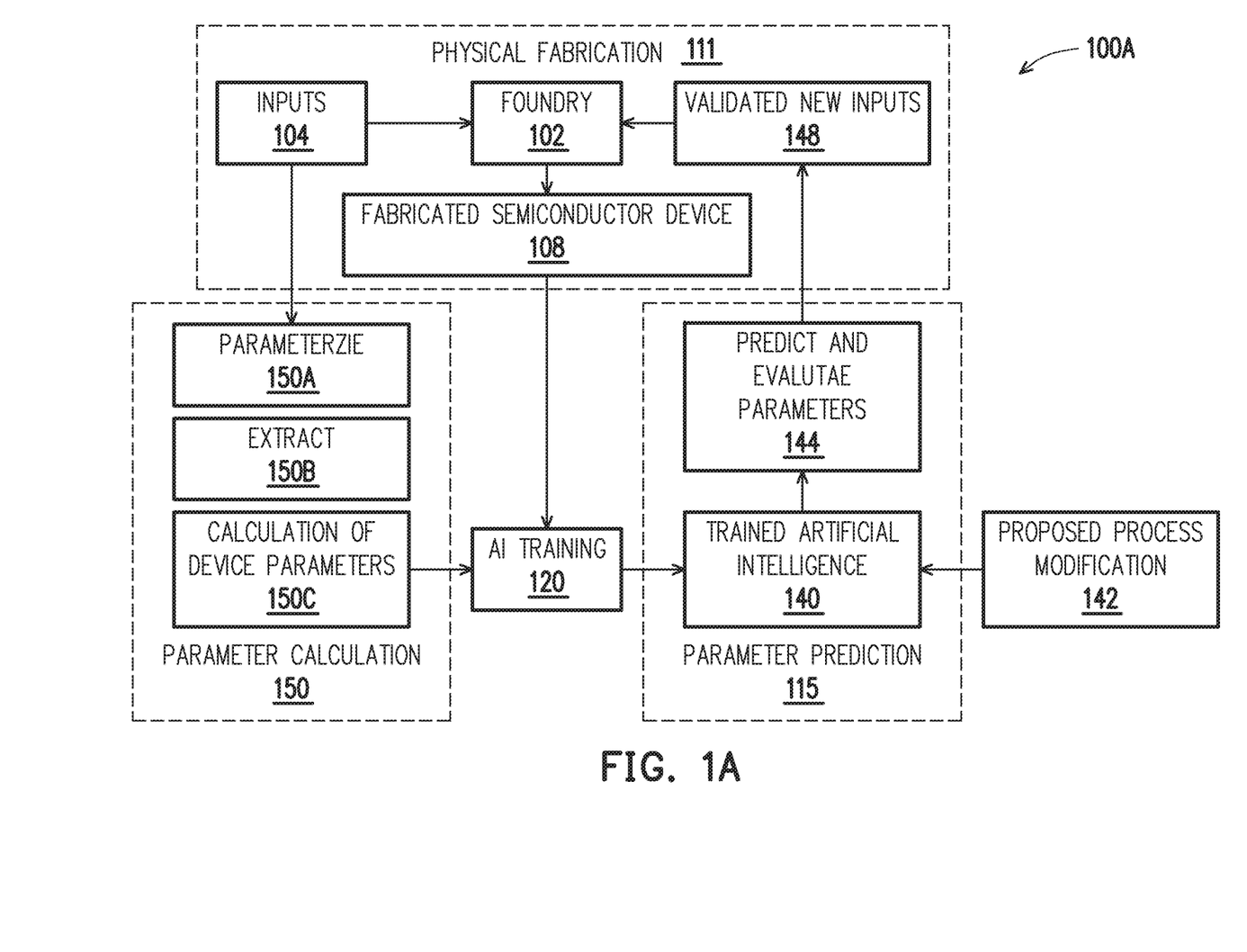
FIG. 1A illustrates a semiconductor device fabrication process in accordance with various embodiments.

FIG. 1A illustrates various aspects 100A of systems and methods in accordance with this disclosure. In embodiments, in a physical fabrication operation, a foundry 102 receives various inputs 104, including as materials and process parameters and fabricates a semiconductor device using such materials and process parameters. Process parameters define the operations and steps performed using various fabrication techniques and tooling. Fabrication processes include various foundry techniques including chemical etching, plasma etching, lithography, mask work design and application, vapor deposition, ion implantation, patterning, and polishing. These processes are employed for example to fabricate integrated circuits in semiconductor materials.

Exemplary process parameters included in inputs 104 may be represented by a value and include a process duration, a line thickness, a line length, a layer thickness, a material change, a dopant, or a thickness direction. Changes to process parameters may cause a change in a resulting semiconductor device 108. For example, new circuit parasitic may arise from changes to a fabrication process. For example, a change in a thickness of a line in a particular direction may cause a cell delay to increase or decrease. These changes may cause a cell delay violation condition (e.g. cell delay is too long, or too short, or does not fall within design parameters). Existence of a violation condition may be a threshold evaluation before a foundry, e.g. 102, implements a fabrication process according to a particular set of inputs, e.g. 104.

After fabrication of a semiconductor device, it may be evaluated for various device parameters, such as a cell delay of a cell of a fabricated semiconductor device 108. That is a device, e.g. 108, may be measured or evaluated to obtain actual measured semiconductor device parameters in order to verify that the semiconductor device operates as expected and without any violation conditions.

As discussed above, prior to fabrication, a process of calculating device parameters 150 from a set of inputs 104 inputs allows a fabricated device to be validated or certified prior to expending time and resources on a fabrication process that results in a violation condition. In embodiments, inputs 104 may be supplied to an appropriately configured computer process in order to calculate various device parameters first by parameterizing the inputs 150A (e.g. material parameters, process parameters), then by extracting device parameters 150B (e.g. RC characterizations) of a device fabricated with inputs 104, and finally by simulating additional device parameters 150C (e.g. device timing conditions, power conditions). One exemplary calculated device parameters may include a calculated cell delay.

After fabrication, calculated device parameters may be compared to measured device parameters to inform the accuracy of the device model. Calculating device parameters is typically a lengthy process involving RC extraction by an RC extraction tool to obtain RC characteristics from a proposed set of process inputs, e.g. 104. These obtained RC characteristics describe physical RC characteristics of a semiconductor device fabricated from a proposed set of process inputs. RC extraction is typically followed by EDA simulation by an EDA tool to simulate the resulting semiconductor device behavior in order to, among other things, identify violation conditions. The calculation process is lengthy and costly, and may take weeks to complete. In embodiments, a calculation process beginning with supplying inputs 104 to a calculation process 150 may take three or more weeks of time executing on modern advanced servers to accomplish a typical validation process.

After calculating device parameters, and after measuring physical device parameters, each type of parameter may be provided to an artificial intelligence (AI) trainer 120. These parameters may be assembled into training data for training an AI using AI trainer 120. In embodiments, training data relied on by AI trainer 120 is a compilation of data for training an untrained artificial intelligence entity on a sensitivity of parameter changes in response to changes in inputs 104. Once compiled, training data may be used to train an untrained artificial intelligence to obtain a trained artificial intelligence 140 by an artificial intelligence training processes as discussed below with reference to FIG. 5.

Having a trained AI 140, a parameter prediction process 115 allows device parameters to be directly predicted and validated. This direct prediction of device parameters alleviates a need to expend substantial resources calculating device parameters in a parameter calculation process such as process 150.

A trained AI 140 is capable of predicting and evaluating 144 one or more device parameters based on a new set of process inputs 148 according to a proposed process modification 142. A proposed process modification may be intended to improve a performance of a fabricated device, e.g. 108, or to reduce a cost involved in fabricating such a device. A proposed process modification 142 is supplied to the trained AI 140, which directly, and accurately, predicts 144 a resulting semiconductor device's parameters and validates these parameters. In embodiments, a validation or certification of predicted parameters may include checks for absence of a violation condition. It will be appreciated that a violation condition may be any condition imposed upon a semiconductor device by, e.g., a designer. For example, predicated device parameters may be evaluated to determine if any predicted cell delay exceeds a threshold value.

If no violation conditions result from the predicted semiconductor device parameters, a validated set of new inputs 148 may be utilized in the foundry 102 for the fabrication of a new semiconductor device based on the new inputs 148 to create a new semiconductor device with new semiconductor values that may be measured to confirm the model and to further add to the training data available for future training of a more well trained artificial intelligences. For example a first process of the semiconductor device foundry may be configured based on one or more parameters associated with, defining, or describing the new inputs 148. In embodiments the one or more parameters associated with, defining, or describing the new inputs 148 may be stored in a semiconductor device data structure generated by a trained AI 140 that predicts and validates the parameters. Alternatively, once validated predicted device parameters may be used directly to create a new EDA device description file that describes a fabricated device fabricated with new inputs 148 in a form that is readable by an EDA tool.

Cell delay is one exemplary parameter of a semiconductor device that may be of particular importance and that is affected by a changes in a semiconductor device fabrication. Cell delay $t_{CD}$ is the amount of time that passes between when an input signal arrives at a semiconductor device cell and when the resulting output signal is propagated from the semiconductor device cell. For example, if a semiconductor device cell includes a logical NOT gate, $t_{CD}$ is the time it takes for an input signal, e.g. carrying a HIGH, to propagate through the internal cell structures (e.g. transistors) to a cell output as the complement of the input signal, e.g. carrying a LOW. Cell delay, $t_{CD}$, is highly dependent on the RC parameters of a semiconductor device, and is a threshold parameter when validating a target process change. For example, if $t_{CD}$ exceeds a desired value, e.g. 1 picosecond, 5 picoseconds, or 10 picoseconds, a violation condition may occur. May alternatively violation conditions may arise from a cell delay. Complicating a violation condition analysis, in embodiments, a fabricated semiconductor device, e.g. 108, has many cells (e.g., millions or trillions of semiconductor structures organized in many cells) that each include a measurable cell delay. For each fabrication instance according to a particular process (a particular combination of materials and process parameters) many cell delays may be measured for various feature dimensions and orientations within the semiconductor device. It will be appreciated that a desired cell delay, or a cell delay threshold may be any suitable delay and may be substantially greater than 1 picosecond, 5 picoseconds, or 10 picoseconds where a target circuit timing operates on timing orders of magnitude greater than picosecond timing.

Figure 1B:
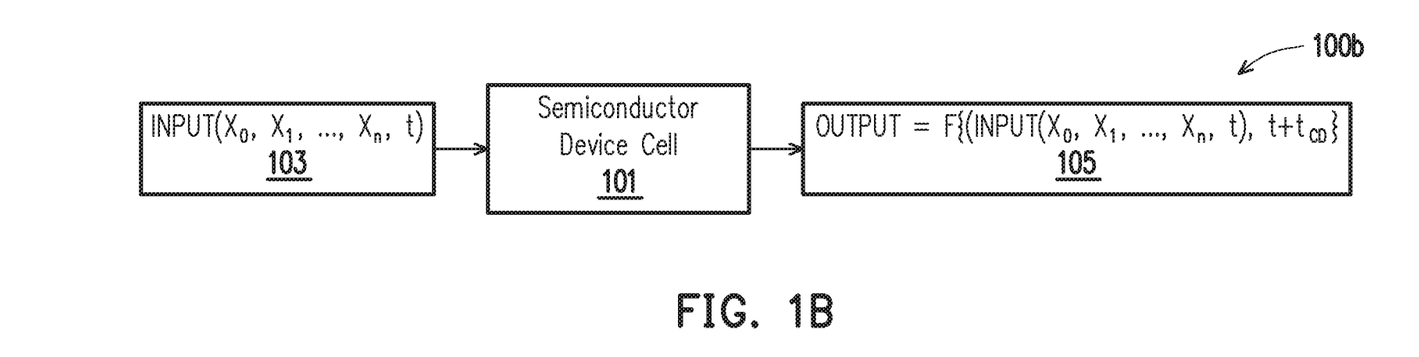
FIG. 1B illustrates aspects of a semiconductor device cell in accordance with various embodiments.

While these values of a time violation condition are provided for exemplary purposes, any suitable desired time condition may apply according to embodiments. A violation condition may also occur if $t_{CD}$ fails to exceed a desired value, or if $t_{CD}$ fails to fall between two desired values. FIG. 1B includes an illustration 100b of cell delay, $t_{CD}$, of a semiconductor device cell 101 according to various embodiments.

A semiconductor device cell 101 may receive various inputs 103 which include $X_0$-$X_n$ arriving at semiconductor device cell 101 at time t. Semiconductor device cell 101 evaluates inputs 103 arriving at time t to obtain an output 105 according to one or more Boolean functions (e.g. $F\{INPUT(X0,X1\ldots,Xn,t)\}$ implemented by the circuitry within semiconductor device cell 101. For inputs at time t=t, an output is achieved at time t+$t_{CD}$, and that delay or difference between the time an input signal arrives (t) and when the output is achieved (at t+$t_{CD}$) is the cell delay ((t+$t_{cd}$)−(t)=$t_{CD}$) Inputs 103 and outputs 105 may each include one or more signals carried on one or more metal lines. For example, input 103 may be a first signal, and when semiconductor device cell 101 is a gate the output 105 is a complement of the first signal delayed by $t_{CD}$. In another embodiment, semiconductor device cell 101 includes two input lines carrying input 103 at time t to a nand gate that feeds a D-flip flop, in which case output(t) is equal to Nand(input (t-tn−$t_{CD}$)), where $t_{CD}$ is the cell delay and Nand(input(t-tn)) is the Nand of input signals one clock cycle (tn) ago. In any case, $t_{CD}$ may be affected by changes to the RC characteristics of the overall semiconductor device, such as changes to one or more resistors or capacitors, or other parasitic resistances or capacitances. For example, $t_{CD}$ may be dependent on changes to $R_0$, $R_1$, $C_0$, $C_1$, ... $C_n$.

Figure 2:
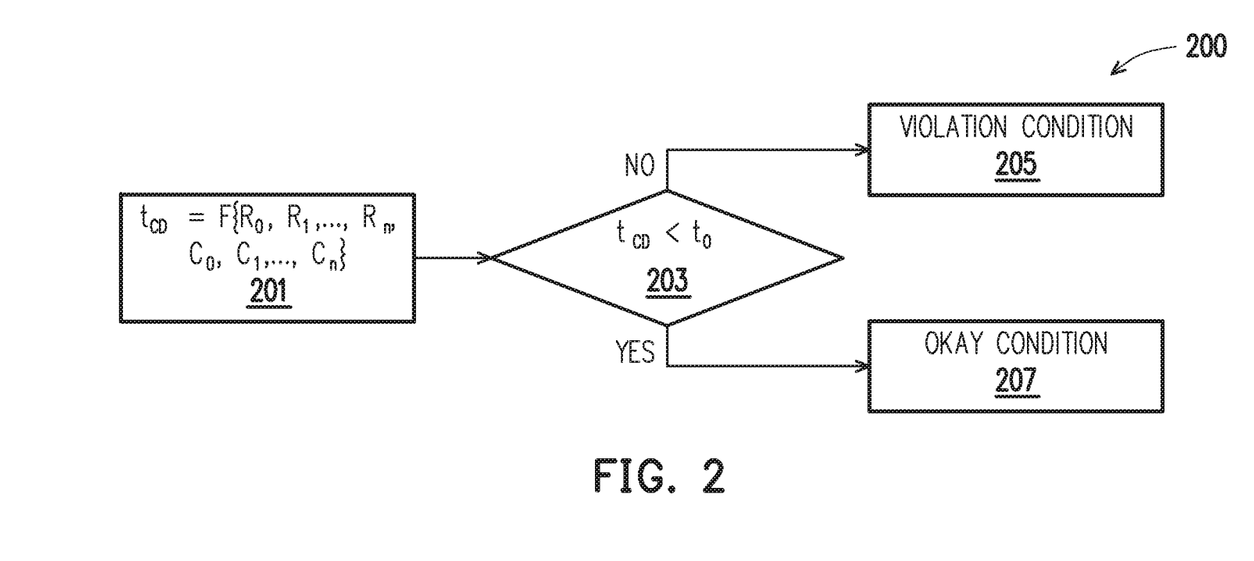
FIG. 2 illustrates aspects of a semiconductor device cell evaluation process in accordance with various embodiments.

FIG. 2 illustrates an evaluation operation 200 for evaluating a semiconductor device parameter to determine if a violation condition exists. For example, a cell delay condition 201 may be evaluated by evaluator 203 (e.g., evaluation 1046). Cell delay 201 is a function of one or more resistances or capacitances of a semiconductor device of which a particular cell associated with the cell delay 201, $t_{CD}$. At evaluator 203, the cell delay $t_{CD}$ is evaluated to determine whether it satisfies a threshold condition. In embodiments a threshold time period is to and $t_{CD}$ is evaluated against to. For example a violation condition may occur when $t_{CD}$>t0. For example, if at 203 it is determined that $t_{CD}$ is not less than t0, a violation condition 205 occurs. If the threshold determination 203 determines that no violation conditions occur, the device is okay 207, indicating a candidate for implementation in physical fabrication.

Figure 3:
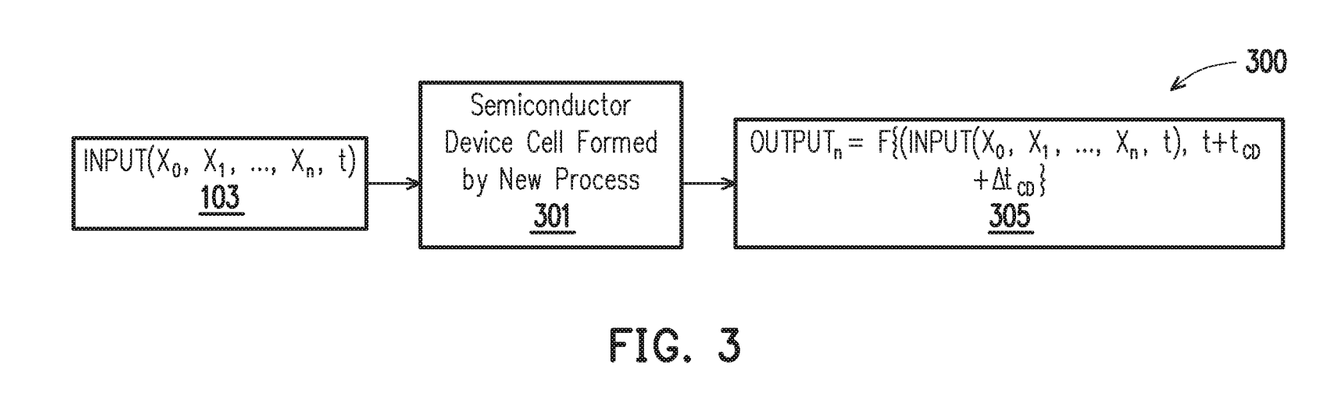
FIG. 3 illustrates aspects of a semiconductor device cell in accordance with various embodiments.

FIG. 3 illustrates an evaluating operation 300 on a modified semiconductor device formed by a new semiconductor fabrication process 301. The new semiconductor device is fabricated of the same $X_0$ to $X_n$ inputs to the fabrication process, but the fabrication process used to fabricated device 301 is modified according to a new fabrication process parameter. In embodiments, during an operation 300, a new semiconductor device according to a new process 301 receives a number, n, of inputs 103 at time t, and creates an output 305 that is based on the same function F{INPUT(X$_0$, X$_1$, ..., X$_n$, t) at time t+tcd+$\Delta t_{CD}$, where $\Delta t_{CD}$ is the change in cell delay as a result of a change in the RC characteristics of the semiconductor device cell 301 as a result of changes in the underlying process. Thus a total cell delay for new semiconductor device cell 301 is $t_{CD}+\Delta t_{CD}$.

Figure 4:
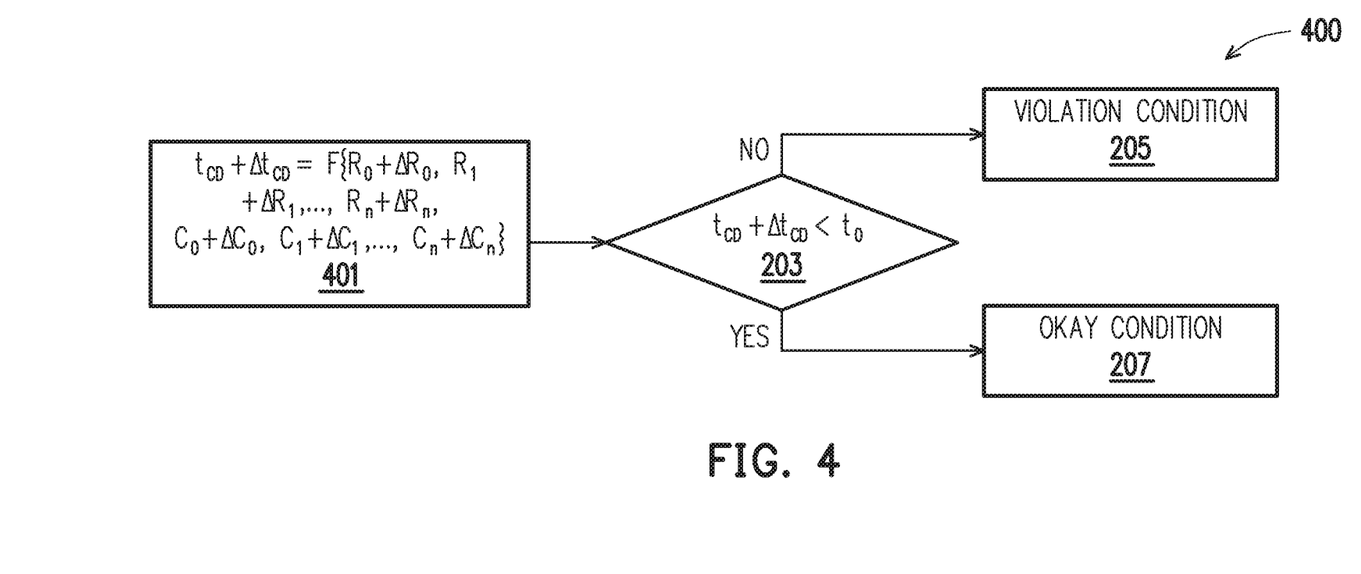
FIG. 4 illustrates aspects of a semiconductor device cell evaluation process in accordance with various embodiments.

FIG. 4 illustrates evaluating a new parameter, using an evaluator 203 to determine if a semiconductor device includes any violation conditions 205. In an example, a new cell delay such as a new cell delay=$t_{CD}+\Delta t_{CD}$, that is depending on new RC characteristics, including $\Delta R_0$, $\Delta R_1$ ..., $\Delta R_n$, $\Delta C_0$, $\Delta C_1$, ..., $\Delta C_n$, is evaluated by evaluator 203 to determine if the new cell delay is satisfactory 207 for fabrication. It will be appreciated that $\Delta t_{CD}$ may be a positive or negative value.

Figure 5:
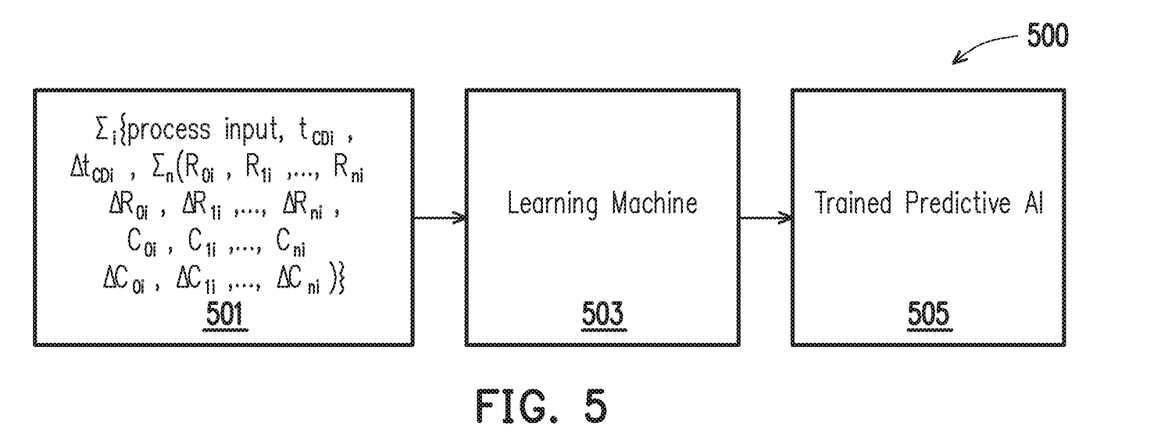
FIG. 5 illustrates a system for training an artificial intelligence in accordance with various embodiments.

FIG. 5 illustrates training a trained predictive AI 505 using training data 501. Training data for a process modificaiton 501 is supplied to a learning machine capable of training an untrained AI entity to become a trained predictive AI. For each process modification, a process input is supplied to the AI, which includes the materials and other process parameters associated with a particular proposed process modification, and associated with that process input, all of the extracted RC characteristics associated with that proposed process modification and the associated cell delay or a change in cell delay.

An artificial intelligence (AI) trainer, such as trainer 120, may employ one or more machine learning techniques using a learning machine 503 to train an untrained artificial intelligence instance (e.g., 1032) to become a trained predictive AI 505, 140. Such an AI trainer 120 may employ various machine learning algorithms to create a predictive AI 505, 140 that is capable of accurately predicting both device parasitics, e.g. parasitic capacitances or parasitic resistances or parasitic inductances, and one or more additional semiconductor parameters, like one or more predicted cell delays for various semiconductor cells. In embodiments, training of a predictive AI, like trained AI 505 or 140, can be performed by trainer 120 employing a learning machine 503 based on supervised learning techniques in which an AI instances receives a desired set of input data each input data element, or group of input elements, corresponding to a desired output value and becomes conditioned to correctly predict the desired outcome based on the input elements or input element groups. For example, an input element group may be a set of inputs 104 and resulting predicted outputs include the device parasitics, and other RC characteristics (e.g. 1056) and device cell delay (e.g. 1058). Alternatively, a trained artificial intelligence 505, 140 may include two trained artificial intelligence entities, a first (not particularly illustrated) that is trained to identify device parameters 505, e.g. including device parasitics, or other RC characteristics (e.g. 1056) based on process inputs, e.g. 104a and 104b. In such cases, trained AI 505, 140 includes a second trained AI that is trained to predict semiconductor device parameters, e.g. a cell delay, based on predicted RC characteristics from the first AI.

In embodiments trained artificial intelligence 505, 140 is a trained dynamic neural network, or a deep dynamic neural network. Such a neural network may comprise a network of perceptrons, or may be a hybrid neural network, a recurrent neural network. Alternatively, trained AI may be a trained support vector machine (SVM). The particular mechanisms for training an artificial intelligence entity of a desired type are known in the art and need not further be discussed.

Figure 6:
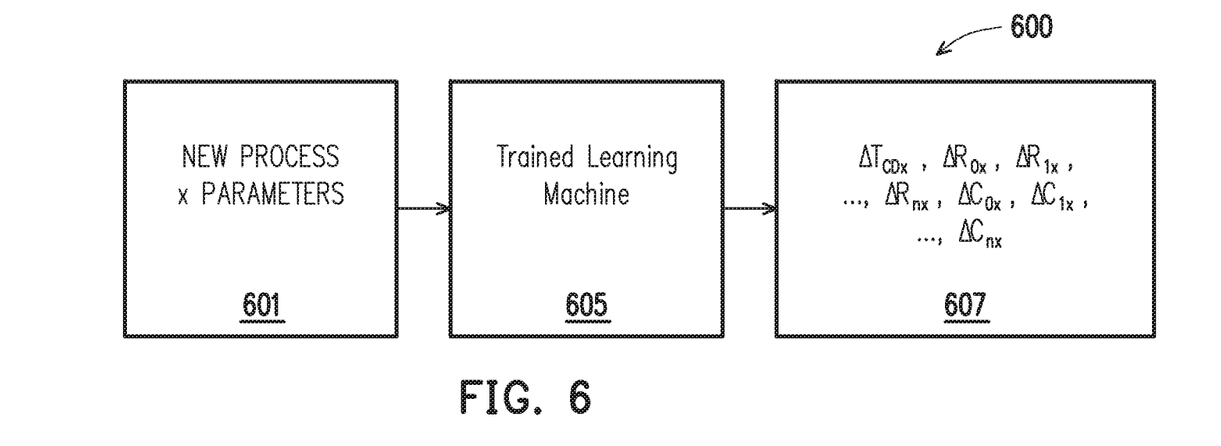
FIG. 6 illustrates a system for predicting a change in a semiconductor device cell delay in accordance with various embodiments.

FIG. 6 illustrates a semiconductor device parameter prediction process 600. Once trained, like AI 140 or AI 505, in embodiments a trained AI 605 is able to accept new process inputs 601 for a new semiconductor device fabrication process x. Based on its training in accordance with embodiments, the trained AI 605 is able to accurately predict a resulting semiconductor device parameters 607, for example, as a part of a process validation or certification. AI 605 is able to predict changes in cell delay cause by change between process x and a known process, $\Delta T_{CDx}$, as well as predict changes in device parasicitcs and other RC factors $\Delta R_{0x}$, $\Delta R_{1x}$, $\Delta R_{nx}$, $\Delta C_{0x}$, $\Delta C_{1x}$, ..., $\Delta C_{nx}$. Trained AI 605 is able to predict new device parameters nearly instantaneously relative to known processes. In some embodiments, trained AI 605 is a sensitivity model for evaluating sensitivity S responsive to input parameters, e.g. 601. Sensitivity model S is able to determine a semiconductor device cell's cell delay's sensitivity to RC changes arising from changes to a fabrication process as described in one or more inputs, e.g. 104, 501, 601. In embodiments, a trained AI 605 is able to resolve a change in cell delay based on a relationship of a resolved sensitivity S being proportional to $\Delta C/\Delta t_{CD}$. In embodiments, a trained AI 605 first determines the impact of process changes to determine a change in capacitance, $\Delta C$, and based on a total $\Delta C$ experience by a signal through a semiconductor device cell, trained AI 605 is able to resolve the change in $t_{CD}$, e.g. $\Delta t_{CD}$.

Figure 7:
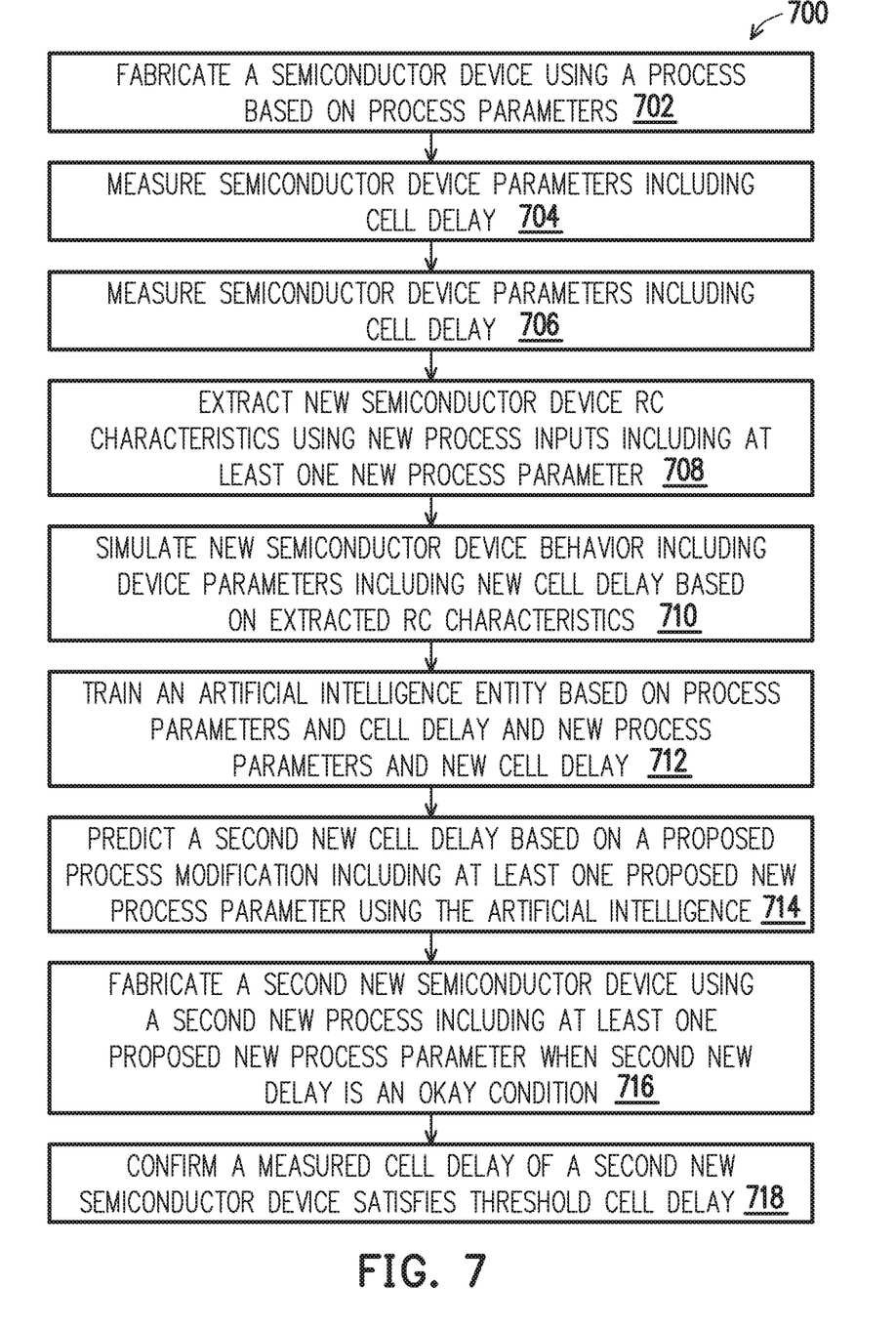
FIG. 7 is a flow chart illustrating aspects of methods in accordance with various embodiments.

FIG. 7 illustrates a flow chart for performing method 700 according to various embodiments. Method 700 includes a step 702 of fabricating a semiconductor device using a process based on process parameters. Then, one or more semiconductor device parameters are measured at 704, including a cell delay that is dependent on one or more process parameters. At 706 a fabrication process is modified by altering at least one process parameter. The modified process parameters are supplied to an RC extraction tool at 708 in order to obtain RC characteristics of a semiconductor device fabricated according to a modified process. At 710 a new semiconductor device fabricated according to a modified process is emulated to obtain new semiconductor device parameters, including new RC characteristics and a new cell delay. At 712, an artificial intelligence entity is trained based on training data including new process parameters and new semiconductor device parameters including a new cell delay. Then, a trained artificial intelligence is provided another new process modification including new proposed process modification having new process parameters in order to predict at 714 another new cell delay. When the predicted new cell delay is evaluated to a good condition (e.g. no violation conditions), a new semiconductor device is fabricated according to the new process based on at least one new proposed process parameters at 716. And at 718, a cell delay of the fabricated new semiconductor device is verified by measuring a cell delay to determine it satisfies a threshold cell delay.

Figure 8A:
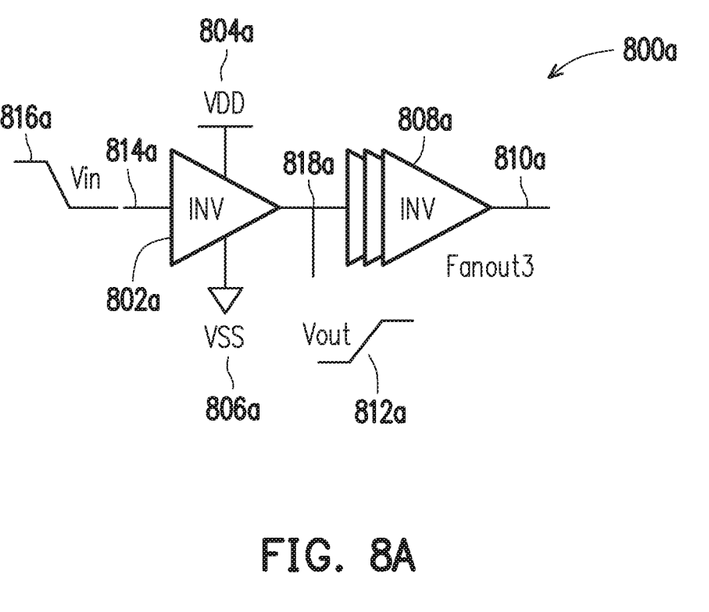
FIG. 8a is a schematic diagram of a semiconductor device fabricated in accordance with various embodiments.
Figure 8B:
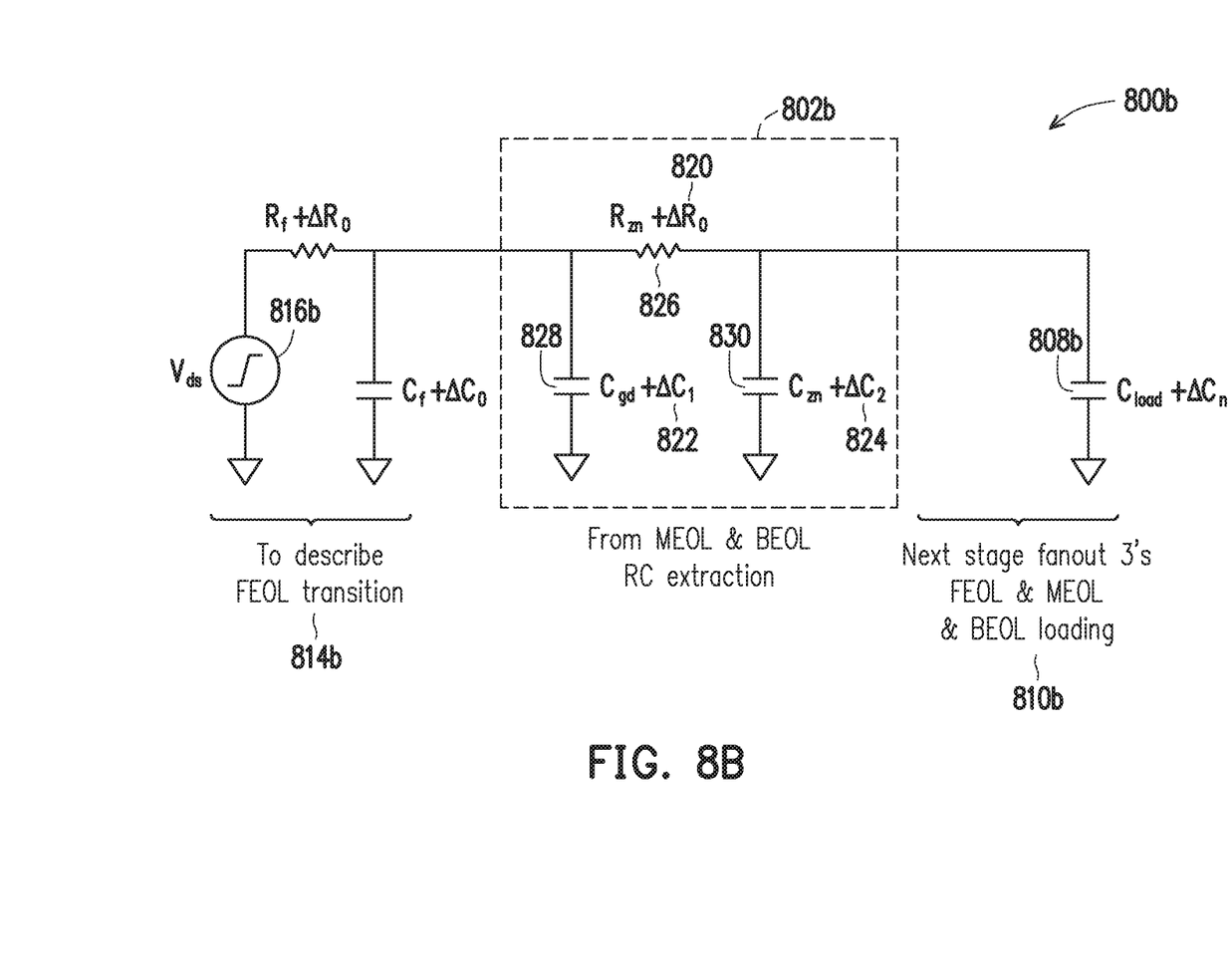
FIG. 8b is a model of parasitic RC components of a semiconductor device fabricated in accordance with various embodiments.

FIGS. 8A and 8B illustrate aspects of modeling a semiconductor device according to various embodiments for determining a semiconductor device parameter value that is dependent on changes in a devices RC characteristics. FIG. 8A includes a model 800a of a semiconductor device cell that includes an inverter 802a supplied by an input line 814a to create an output on an output line 818a that feeds a load 808a leading to a fanout of three 810a. Input line 814a carries an input signal 816a, Vin, and provides an output signal, 812a, Vout to load 808a. The device is powered by VDD 804a and VSS 806a. Device 800a is fabricated in a semiconductor integrated circuit according to a process. That fabrication process, e.g. 106, according to various inputs, e.g. 104, results in an analogue device model 800b that includes various RC characteristics.

In embodiments, an input portion 814b of the model 800b models the input RC characteristics of the input line 814a descriptive of a front end of line (FEOL) transition that comprises one or more transistors in one or more integrated circuits. The one or more transistors of the FEOL process provide a signal accompanied by an input resistance $R_f$, and an input capacitance $C_f$. Training data related to input portion 814b of a model 800b may comprise extracted RC parameters extracted from a FEOL process. In embodiments, training data includes an input capacitance of the first semiconductor device cell, input-to-output coupling capacitance of the first semiconductor device cell, a load capacitance of the first semiconductor device cell, and a device cell gate resistance, a device cell drain resistance, and a device cell source resistance.

In embodiments, an output portion 810b of the model 800 models output RC characteristics of the output line 818a, including portions of a mid-end of line (MEOL) and back end of line (BEOL) components as well as a fanout into FEOL components. In embodiments, the MEOL layer is disposed between the BEOL layer and the FEOL layer and includes a poly-gate, drain, source, trench-contact, or a via. In embodiments the BEOL components includes a metallization layer, and the MEOL components are disposed between the BEOL components and the FEOL components and comprises various transistor components of an integrated circuit and may contain interconnection structures like microbumps and through silicon vias. Training data related to an output portion 810b of a model 800b may comprise various extracted RC parameters extracted from a FEOL, a MEOL and a BEOL process. Output portion 810b includes a load capacitance 808b $C_{load}$.

In embodiments an exemplary cell includes an inverter 802a, which model 800b models in a collection of analog devices 802b with RC characteristics, including capacitances $C_{gd}$ 828, $C_{zn}$ 830, and resistance $R_{zn}$ 826. In embodiments, aspects of a modelled cell including an inverter 802b include BEOL and MEOL components. Training data related to a modelled exemplary cell including an inverter 802b may comprise various extracted RC parameters extracted from a MEOL and a BEOL process.

As illustrated in FIG. 8B, a change in various RC factors as a result of a change in process results in a change in modelled RC factors. Thus a fabricated circuit prior to a process change, for example as in step 702 would include a semiconductor device cell having RC factors $R_{zn}$, $C_{gd}$, and $C_{zn}$ as would be measured in step 704. Then, after modifying a process as in step 706, and fabricating a new semiconductor device as in step 716, a new measurement would obtain modified RC factors $R_{zn}+\Delta R_{zn}$, $C_{gd}+\Delta C_{gd}$, and $C_{zn}+\Delta C_{zn}$, where $\Delta R_{zn}=\Delta R_0$ 820, $\Delta C_{gd}=\Delta C_1$ 824, and $\Delta C_{zn}=\Delta C_2$ 824. This information may then be used as in step 712 to train an AI to predict a cell delay based on a sensitivity factor S associates a change in RC factors to a change in cell delay, for example where sensitive S is proportional to $\Delta C/\Delta t_{CD}$.

In accordance with various embodiments disclosed herein, a trained predictive AI is capable of predicting semiconductor device parameters, such as parasitics and cell delay of a fabricated semiconductor device. This predicted cell delay may be relied upon to certify or validate a fabrication process. Alternatively, extracted RC characteristics and other device parameters may be used to generate an EDA tool device descriptor file. Such a device descriptor file may include an electronic data automation (EDA) data structure that is configured for use in an electronic data automation tool such as a SPICE tool. In embodiments a descriptor data structure in a device descriptor file is a semiconductor device description data structure that is a SPICE description file or a CADENCE description file or a Synopsys description file or a Mentor description file. These files allows part manufacturers to distribute an accurate description of a semiconductor device based on predicted values provided by a predictive AI in accordance with various embodiments.

Figure 9:
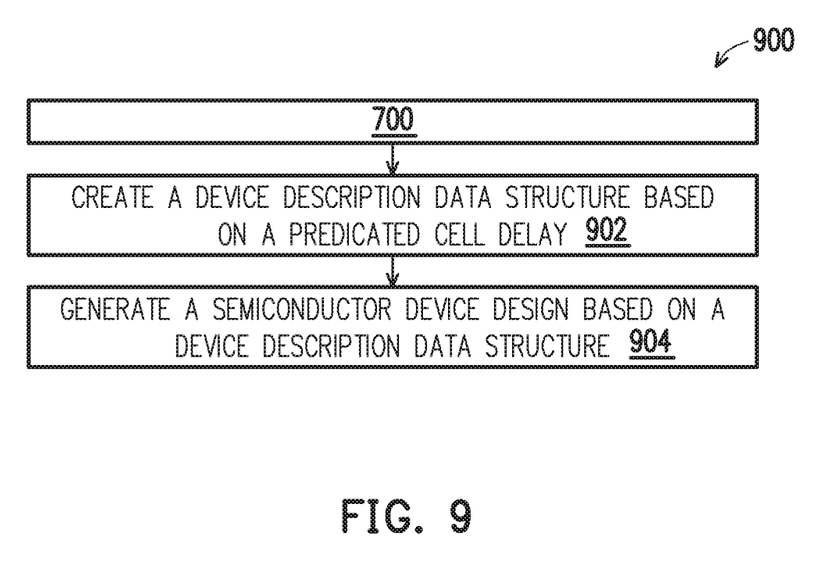
FIG. 9 is a flow chart illustrating aspects of methods in accordance with various embodiments.

FIG. 9 illustrates a process 900 for creating a device design including a new device fabricated according to a new fabrication process including modifications to a process parameter or input. For example, following form process 700 a device description data structure is generated at 902 that includes various semiconductor device parameters associated with a cell delay that does not create a violation conditions. And, at 904, a new semiconductor device design is generated, for example using and EDA tool capable of reading the device descriptive data structure generated in step 902, using a device description data structure.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

Figure 10:
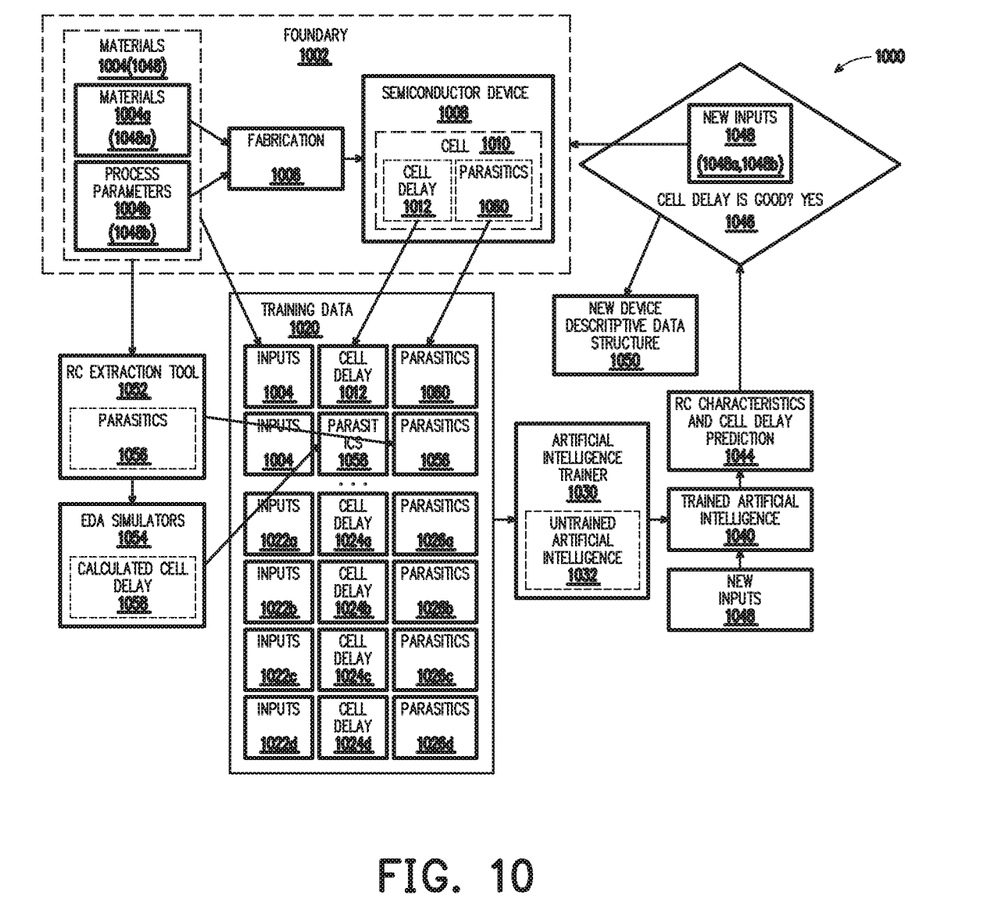
FIG. 10 illustrates a semiconductor device fabrication process in accordance with various embodiments.

FIG. 10 illustrates various aspects 1000 of systems and methods in accordance with this disclosure. In embodiments, in a foundry 1002, various inputs 1004 such as materials 1004a and parameters 1004b are provided to a fabrication process 1006 to fabricate a semiconductor device 1008. The process parameters 1004b define the operations and steps performed using the various systems and processes constituting fabrication process 1006, thereby defining the configuration and resulting structure of semiconductor device 1008. These fabrication processes include various foundry techniques including chemical etching, plasma etching, lithography, mask work design and application, vapor deposition, ion implantation, patterning, and polishing. The process parameters defining the various techniques are employed using various materials to fabricate a semiconductor device, such as an integrated circuit.

Exemplary process parameters may be represented by a value and include a process duration (e.g. the amount of time a deposition occurs), a line thickness, a line length, a layer thickness, a material change, a dopant, or a thickness direction. A change in circuit parasitic may arise from any change to a fabrication process. For example, a semiconductor device cell 1010 of a semiconductor device 1008 has a cell delay 1012 that is affected by one or more process parameters 1004b, such that changes to process parameters 1004b, such as a change in thickness, may cause a cell delay to increase or decrease sufficiently to violate a cell delay condition. A cell delay violation condition may include a threshold evaluation requiring that a cell delay is less than a desired cell delay value, or a cell delay is between two cell delay values, or a cell delay is greater than a desired cell delay value.

After fabrication 1006 various device parameters, such as a cell 1010 cell delay 1012, may be measured to obtain actual measured semiconductor device parameters in order to verify that the semiconductor device operates as expected and without any violation conditions. In embodiments, a fabricated semiconductor device has many (between millions and trillions of semiconductor devices organized in cells like cell 1010) cells that, like cell 1010, include a measurable cell delay, like cell delay 1012. For each fabrication instance according to a particular process (a particular combination of materials and process parameters) many cell delays may be measured for various feature dimensions.

As discussed above, prior to fabrication 1006, inputs 1004 may be supplied to an RC extraction tool 1052 to obtain device parasitics 1056, and EDA simulations 1054 based on device parasitics, in order to calculate various calculated device parameters. Calculated device parameters may include a calculated cell delay 1058. In embodiments, a cell delay 1012 measured after fabrication 1006 may be compared to a previous calculated cell delay 1058 to confirm that the calculated cell delay 1058 accurately determined the cell delay 1012 fabricated by fabrication 1006 in foundry 1002, thereby confirming the accuracy of the model employed by RC extraction tool 1052 and EDA simulator 1054. For each calculation instance using an EDA tool, based on a particular set of derived parasitics, many cell delays, like calculated cell delay 1058, may be calculated. Each process, RC extraction by an RC extraction tool 1052 and EDA simulation by EDA simulators 1054, takes on average 1.5-3 weeks of running time on modern advanced servers to accomplish a typical validation process.

From the various measured semiconductor device parameters, like cell delay 1012, and from various calculated semiconductor device parameters, like calculated cell delay 1058, and inputs 1004, training data 1020 is compiled. Training data 1020 may include many instances of inputs and corresponding measured or calculated semiconductor device parameters. In embodiments, training data 1020 is a compilation of data for training an untrained artificial intelligence entity on a sensitivity of cell delay changes in response to changes in input parameters 1004b and input materials 1004a. Training data 1020 may then include particular inputs 1004, 1022a, 1022b, 1022c, 1022d and so on for each process variation, fabricated or calculated, for which a calculated cell delay 1058, 1024a, 1024b, 1024c, 1024d or fabricated cell delay 1012, and related parasitics 1060, 1056, 1026a, 1026b, 1026c, 1026d are obtained. Once compiled, training data 1020 is used to train an untrained artificial intelligence 1032 to obtain a trained predictive artificial intelligence 1040 by an artificial intelligence training process 1030 as discussed above with reference to FIG. 5.

Having a trained predictive AI 1040, the AI 1040 is capable of resolving one or more device parameters based on a new set of process inputs 1048, which may include new materials 1048a or new process parameters 1048b. New inputs 1048 may be supplied to the trained AI, which is able to directly, and accurately, predict a resulting semiconductor device's parameters 1044 after fabrication according to new inputs 1048. These resulting predicted semiconductor device parameters 1044 may include predicted RC characteristics of the semiconductor device as well as predicted cell delay. Predicted semiconductor device parameters 1044 may be evaluated 1046 to ensure that no violation conditions will result based on the predicted values 1044. For example, the results may be evaluated to determine if any predicted cell delay exceeds a threshold value. If no violation conditions result from evaluation 1046 the predicted semiconductor device parameters, the new inputs 1048 will be utilized in the foundry for the fabrication of a new semiconductor device based on the new inputs 1048. And a new device description data structure 1050 may be generated to describe a device fabricated according to the modified process. New device description data structure 1050 may be relied upon in semiconductor device design tools to design a new semiconductor device as in step 904. From this design a new semiconductor device may be fabricated to include a semiconductor device described by data structure 1050. In this way, the new inputs 1048 may be supplied to fabrication 1006 to create a new semiconductor device with new semiconductor values that may be measured to confirm the model and to further add to the training data available for training more advanced predictive artificial intelligences. Additionally, predicted values 1044 may be relied upon to create an EDA circuit description file that may be read by an EDA tool in order to simulate the behavior of the device within larger systems.

Figure 11:
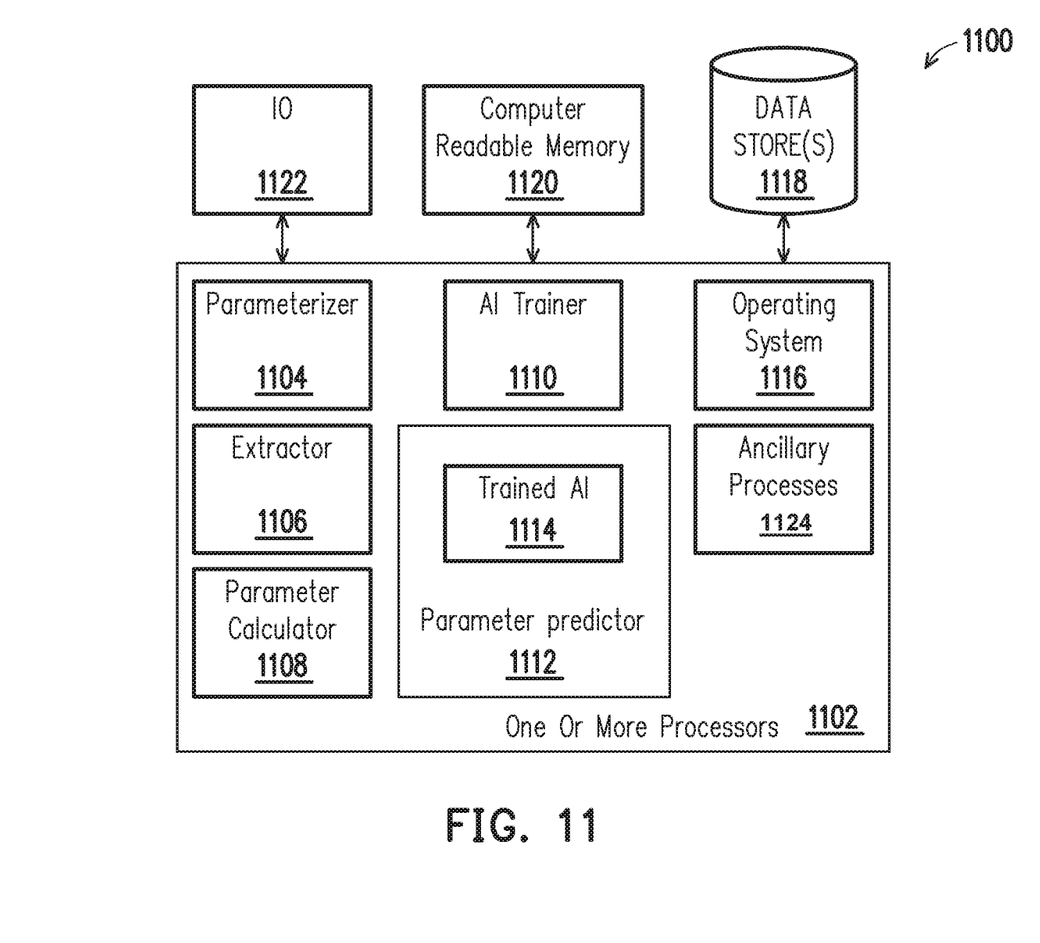
FIG. 11 illustrates various aspects 1000 of systems and methods in accordance with this disclosure.

FIG. 11 illustrates various aspects 1000 of systems and methods in accordance with this disclosure. In one or more embodiments a processing system 1100 is provided. The processing system includes one or more processors 1102 coupled to a computer readable memory 1120 and one or more datastores 1118 for executing one or more processes. In embodiments, one or more processors 1102 load into a computer readable memory 1120 one or more computer readable executable files from one or more data stores 1118 containing instructions for executing one or more processes, e.g. processes 1104, 1106. 1108, 1110, 1112, 1116, and 1118. Once loaded into memory 1120, the one or more processors 1102 execute the instructions to carry out one or more aspects of the present disclosure. For example, the processing system's 1100 one or more processors 1102 execute processes that perform parameter calculation (e.g., as in parameter calculation 150) such as parameterizer 1104 that, e.g., parameterizes 150A inputs 104 to obtain material parameters or process parameters, and such as extractor 1106 that, e.g. extracts 150B one or more RC characterizations of a device formed of a process based on one or more process inputs, and such as parameter calculator 1108 which may simulate additional device parameters (e.g. parameters such as device timing conditions, power conditions), e.g. as in calculation of device parameters 150C.

Processors 1102 may further execute an AI trainer process 1110 for training an untrained AI instance. In embodiments, an AI training instance may receive calculated device parameters, and measured physical device parameters, which may be assembled into training data for training an AI using AI trainer, such as AI trainer 120. In embodiments, training data relied on by AI trainer process 1110 is a compilation of data for training an untrained artificial intelligence entity on a sensitivity of parameter changes in response to changes in process inputs, e.g. inputs 104. Once compiled, training data may be used to train an untrained artificial intelligence to obtain a trained artificial intelligence, e.g. 140 or 1114, by an artificial intelligence training processes 1110, e.g. such as discussed with reference to FIG. 5. Having trained a trained AI, e.g. 1114 or 140, a parameter predictor process 1112 may interact with a trained AI, e.g. 1114 or 140, e.g. as with parameter prediction 115. A parameter prediction, as in parameter prediction 115, process 1112 allows newly proposed processes, e.g. proposed process modification 142, device parameters to be directly predicted, as in 144, and validated by a trained AI, e.g. 1114 or 140, without requiring the substantial resources calculating device parameters in a parameter calculation processes required by processes 1104, 1106, and 1108.

Processors 1102 may execute the processes described above and allow interface to those processes by a user through an operating system 1116, which may manage and facilitate a user's interaction with one or of the processes described above. And as will be appreciated one or more ancillary process 1124 may also execute to control one or more inputs or outputs, e.g. through I/O 1122, which may include among other things, a keyboard, a mouse, a display, audio I/O, ancillary processes 1124 may also include any other useful processes, such as text recognition, speech recognition, networking protocols, drivers, kernels, security programs, and the like, and communications programs such as email, web browser, or otherwise. It will be appreciated that the various processes described herein with reference to FIG. 11 are not intended to be limiting, but instead to be illustrative of a processing system in accordance with this disclosure.

In one embodiment, a semiconductor device fabrication process for fabricating a first semiconductor device cell using a first process based on a first process parameter or material comprises extracting semiconductor device parameters from the first process parameters to obtain extracted semiconductor device parameters of a first semiconductor device cell including a first cell delay of the first semiconductor device cell. And the fabrication process includes training an artificial intelligence to obtain a predictive artificial intelligence using training data as input, the training data comprising the extracted semiconductor device cell parameters and the first process parameter or material. A proposed process modification is provided to the predictive artificial intelligence to generate a predicted cell delay by the predictive artificial intelligence. And, the predicted cell delay is evaluated against a cell delay threshold. When the predicted cell delay satisfies the cell delay threshold, a new semiconductor device cell is fabricated using a modified process incorporating the proposed process modification.

In an interrelated embodiment, a process for creating a semiconductor device description data structure descriptive of a first semiconductor device cell fabricated according to a first process based on a first process parameter or material comprises extracting semiconductor device parameters to obtain extracted semiconductor device parameters of a first semiconductor device cell including a first cell delay of the first semiconductor device cell. And, the process includes training an artificial intelligence to obtain a predictive artificial intelligence using training data as input, the training data comprising the extracted semiconductor device cell parameters and the first process parameter or material. A proposed process modification is provided to the predictive artificial intelligence to generate a predicted cell delay by the predictive artificial intelligence. The predicted cell delay is evaluated against a cell delay threshold. When the predicted cell delay satisfies the cell delay threshold, a semiconductor device description data structure associated with the predicted cell delay is generated.

In an interrelated embodiment, a process for forming a semiconductor device based on a description data structure descriptive of a first semiconductor device cell fabricated using a first process based on a first process parameter or material includes configuring a first semiconductor device process according to one or more semiconductor device parameters. Then forming a semiconductor device using the configured first semiconductor device process, such that the one or more semiconductor device parameters are extracted from a semiconductor device data structure. The semiconductor device data structure includes a semiconductor device description data structure descriptive of a first semiconductor device cell fabricated using a first process based on a first process parameter or material comprises one or more semiconductor device parameters associated with a predicted cell delay predicted by a trained predictive artificial intelligence. The trained predictive artificial intelligence predicted the predicted cell delay by extracting semiconductor device parameters to obtain extracted semiconductor device parameters of a first semiconductor device cell including a first cell delay of the first semiconductor device cell; training an artificial intelligence to obtain a predictive artificial intelligence using training data as input, the training data comprising the extracted semiconductor device cell parameters and the first process parameter or material; providing a proposed process modification to the predictive artificial intelligence to generate a predicted cell delay by the predictive artificial intelligence; and evaluating the predicted cell delay against a cell delay threshold; and when the predicted cell delay satisfies the cell delay threshold, generating a semiconductor device description data structure based on the predicted cell delay.

In an interrelated system for implementing process changes in a semiconductor device fabrication process. The system includes one or more processors coupled to memory and a data store storing instructions which when loaded into the memory and executed by at least one of the one or more processors cause the system to perform steps including configuring a first semiconductor device process according to one or more semiconductor device parameters. Then forming a semiconductor device using the configured first semiconductor device process, such that the one or more semiconductor device parameters are extracted from a semiconductor device data structure. The semiconductor device data structure includes a semiconductor device description data structure descriptive of a first semiconductor device cell fabricated using a first process based on a first process parameter or material comprises one or more semiconductor device parameters associated with a predicted cell delay predicted by a trained predictive artificial intelligence. The trained predictive artificial intelligence predicted the predicted cell delay by extracting semiconductor device parameters to obtain extracted semiconductor device parameters of a first semiconductor device cell including a first cell delay of the first semiconductor device cell; training an artificial intelligence to obtain a predictive artificial intelligence using training data as input, the training data comprising the extracted semiconductor device cell parameters and the first process parameter or material; providing a proposed process modification to the predictive artificial intelligence to generate a predicted cell delay by the predictive artificial intelligence; and evaluating the predicted cell delay against a cell delay threshold; and when the predicted cell delay satisfies the cell delay threshold, generating a semiconductor device description data structure based on the predicted cell delay.

In an interrelated method of implementing process changes in a semiconductor device fabrication process. The method includes compiling training data for training an artificial intelligence to a sensitivity between parameters of a process modification and changes in RC characteristics, and also a sensitivity between parameters of a process modification and a change in cell delay. In embodiments the trained AI predicts changes in RC characteristics and then predicts changes in cell delay based on a sensitivity between RC characteristic changes and cell delay changes. Once trained on the sensitivity, the AI is able to directly predict a change in cell delay based on process modification parameters, thereby eliminating weeks of resource intensive computational simulations.

The methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A semiconductor device fabrication process for fabricating a first semiconductor device cell using a first process based on a first process parameter or material comprising:
    extracting semiconductor device parameters from the first process parameters to obtain extracted semiconductor device parameters of a first semiconductor device cell including a first cell delay of the first semiconductor device cell;
    training an artificial intelligence to obtain a predictive artificial intelligence using training data as input, the training data comprising the extracted semiconductor device cell parameters and the first process parameter or material;
    providing a proposed process modification to the predictive artificial intelligence to generate a predicted cell delay by the predictive artificial intelligence; and
    evaluating the predicted cell delay against a cell delay threshold; and
    when the predicted cell delay satisfies the cell delay threshold, fabricating a new semiconductor device cell using a modified process incorporating the proposed process modification.

2. The semiconductor device fabrication process of claim 1, wherein the predictive artificial intelligence generates a predicted cell delay directly from the provided proposed process modification parameters.

3. The semiconductor device fabrication process of claim 1, further comprising:
    modifying the first process to obtain a second process based on a second process parameter or material;
    extracting second semiconductor device parameters to obtain second extracted semiconductor device parameters of the second semiconductor device cell,
    wherein the training data further comprises the second process parameter or material and the second extracted semiconductor device cell parameters.

4. The semiconductor device fabrication process of claim 3, further comprising:
    modifying the first process to obtain a plurality of processes based on a plurality of process parameters or materials, such that each of the plurality of processes is associated with fabricating a distinct one of a plurality of semiconductor device cells based on a respective combination of the plurality of semiconductor device process parameters or materials;
    extracting a plurality of semiconductor device parameters each associated with a distinct one of the plurality of semiconductor device cells,
    wherein the training data further comprises the plurality of extracted semiconductor device parameters.

5. The semiconductor device fabrication process of claim 1, wherein the first process parameter is a process duration, a line thickness, a line length, a layer thickness, or a dopant further wherein the extracted semiconductor device parameters of the first semiconductor device cell include a resistance or a capacitance.

6. The semiconductor device fabrication process of claim 1, wherein the new semiconductor device cell and the first semiconductor device cell each include an inverter or a logical NOT gate.

7. The semiconductor device fabrication process of claim 1, wherein the threshold requires that the predicted cell delay is less than a desired cell delay value, or the predicted cell delay is greater than a desired cell delay value.

8. The semiconductor device fabrication process of claim 1, wherein the threshold requires that the predicted cell delay is between two cell delay threshold values.

9. The semiconductor device fabrication process of claim 1, further comprising generating an electronic data automation (EDA) data structure that is configured for use in an electronic data automation tool.

10. The semiconductor device fabrication process of claim 8, further comprising using the EDA data structure to design a new semiconductor device.

11. The semiconductor device fabrication process of claim 1, wherein the first semiconductor device cell and the new semiconductor device cell each include an inverter.

12. The semiconductor device fabrication process of claim 1, wherein the predictive artificial intelligence is configured to perform sensitivity analysis including:
    predicting a change in a capacitance, wherein generating a predicted cell delay by the predictive artificial intelligence is based on the predicted change in the capacitance.

13. The semiconductor device fabrication process of claim 1, wherein the first semiconductor device cell and the new semiconductor device cell each include a NAND gate or a D flip-flop.

14. The semiconductor device fabrication process of claim 1 further comprising:

extracting the RC features to obtain extracted RC features of the first process including: (i) a first capacitance between a first power layer and a mid-end of line (MEOL) layer and a second capacitance between a second power layer and the MEOL layer; or (ii) a coupling capacitance between the back-end-of-line (BEOL) and the MEOL layer, wherein the training data includes one or more of the extracted RC features.

15. The semiconductor device fabrication process of claim 14, where the BEOL layer is a metallization layer, the FEOL layer comprises one or more transistors, capacitors, or resistors, and the MEOL layer is disposed between the BEOL layer and the front-end-of-line (FEOL) layer and comprises a poly-gate, drain, source, trench-contact, or via.

16. The semiconductor device fabrication process of claim 1, wherein the training data includes an input capacitance of the first semiconductor device cell, input-to-output coupling capacitance of the first semiconductor device cell, a load capacitance of the first semiconductor device cell, and a device cell gate resistance, a device cell drain resistance, and a device cell source resistance.

17. A process for creating a semiconductor device description data structure descriptive of a first semiconductor device cell fabricated according to a first process based on a first process parameter or material, comprising:
   extracting semiconductor device parameters to obtain extracted semiconductor device parameters of a first semiconductor device cell;
   training an artificial intelligence to obtain a predictive artificial intelligence using training data as input, the training data comprising the extracted semiconductor device cell parameters and the first process parameter or material;
   providing a proposed process modification to the predictive artificial intelligence to generate a predicted cell delay by the predictive artificial intelligence; and
   evaluating the predicted cell delay against a cell delay threshold; and
   when the predicted cell delay satisfies the cell delay threshold, generating a semiconductor device description data structure associated with the predicted cell delay.

18. The process for creating a semiconductor device description data structure of claim 17, further comprising:
   fabricating a new semiconductor device cell; and
   confirming a new cell delay of the new semiconductor device cell satisfies a cell delay threshold.

19. The process for creating a semiconductor device description data structure of claim 17, wherein the semiconductor device description data structure is a SPICE description file or a CADENCE description file or a Synopsys description file or a Mentor description file.

20. A system for forming a semiconductor device based on a description data structure descriptive of a first semiconductor device cell fabricated using first process inputs based on a first process parameter or material, comprising:
   one or more processors coupled to memory and a data store storing instructions which when loaded into the memory and executed by at least one of the one or more processors cause the system to perform the following steps:
   configure a first semiconductor device process according to one or more semiconductor device parameters;
   form a semiconductor device with the configured first semiconductor device process, wherein the one or more semiconductor device parameters are extracted from a semiconductor device data structure that includes one or more semiconductor device parameters associated with a predicted cell delay predicted by a trained predictive artificial intelligence by:
   extracting semiconductor device parameters to obtain extracted semiconductor device parameters of a first semiconductor device cell;
   training an artificial intelligence to obtain a predictive artificial intelligence using training data as input, the training data comprising the extracted semiconductor device cell parameters and the first process parameter or material;
   providing a proposed process modification to the predictive artificial intelligence to generate a predicted cell delay by the predictive artificial intelligence; and
   evaluating the predicted cell delay against a cell delay threshold; and
   when the predicted cell delay satisfies the cell delay threshold, generating a semiconductor device description data structure based on the predicted cell delay.

* * * * *